United States Patent
Jeong et al.

(10) Patent No.: US 11,974,393 B2
(45) Date of Patent: Apr. 30, 2024

(54) FLEXIBLE ELECTRODE CIRCUIT CAPABLE OF BEING 3D CIRCUIT PRINTED STRAIN SENSOR USING SAME, AND MANUFACTURING METHOD THEREFOR

(71) Applicant: POSTECH Research and Business Development Foundation, Pohang-si (KR)

(72) Inventors: Unyong Jeong, Pohang-si (KR); Veerapandian Selvaraj, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 106 days.

(21) Appl. No.: 17/781,139

(22) PCT Filed: Dec. 14, 2020

(86) PCT No.: PCT/KR2020/018243
§ 371 (c)(1),
(2) Date: May 31, 2022

(87) PCT Pub. No.: WO2021/201376
PCT Pub. Date: Oct. 7, 2021

(65) Prior Publication Data
US 2023/0044133 A1 Feb. 9, 2023

(30) Foreign Application Priority Data
Mar. 31, 2020 (KR) .................. 10-2020-0038722

(51) Int. Cl.
*H05K 1/02* (2006.01)
*C08L 23/08* (2006.01)
(Continued)

(52) U.S. Cl.
CPC .......... *H05K 1/028* (2013.01); *C08L 23/0853* (2013.01); *G01L 1/2287* (2013.01); *H05K 1/097* (2013.01)

(58) Field of Classification Search
CPC .............................. H05K 1/028; H05K 1/097
See application file for complete search history.

(56) References Cited

U.S. PATENT DOCUMENTS

2016/0317992 A1 11/2016 Thuo et al.
2018/0148584 A1* 5/2018 Chu .................. H01L 23/49883

FOREIGN PATENT DOCUMENTS

JP 2009027102 2/2009
KR 20160103083 8/2016
(Continued)

OTHER PUBLICATIONS

KIPO, PCT Search Report of PCT/KR2020/018243 dated Apr. 5, 2021.
KIPO, Office Action of KR 10-2020-0038722 dated Sep. 23, 2021.

*Primary Examiner* — Sherman Ng
(74) *Attorney, Agent, or Firm* — LEX IP MEISTER, PLLC

(57) ABSTRACT

Proposed are a flexible electrode circuit capable of being foamed through 3D circuit printing, a strain sensor using the same, and a manufacturing method thereof. The flexible electrode circuit includes a flexible substrate and an electrode foamed on the flexible substrate. The electrode includes a conductive line layer and a passivation layer. The conductive line layer includes a matrix including an elastic polymer and a conductive line having conductive liquid metal microparticles dispersed in the matrix. The passivation layer includes a coating portion coated on the conductive line and having an elastic polymer.

16 Claims, 13 Drawing Sheets

(51) Int. Cl.
G01L 1/22 (2006.01)
H05K 1/09 (2006.01)

(56) References Cited

FOREIGN PATENT DOCUMENTS

| | | |
|---|---|---|
| KR | 20160105174 | 9/2016 |
| KR | 20170065673 | 6/2017 |
| KR | 20170094266 | 8/2017 |
| KR | 20180062243 | 6/2018 |
| KR | 102004645 | 7/2019 |

\* cited by examiner

FLEXIBLE ELECTRODE CIRCUIT CAPABLE OF BEING 3D CIRCUIT PRINTED STRAIN SENSOR USING SAME, AND MANUFACTURING METHOD THEREFOR

TECHNICAL FIELD

The present invention relates to a flexible electrode circuit that can be formed by 3D circuit printing, a strain sensor using the same, and a method of manufacturing the same. More particularly, the present invention relates to a flexible electrode circuit that can be foamed by 3D circuit printing because the flexible electrode circuit includes a conductive line layer and a passivation layer, in which the conductive line layer includes a matrix containing an elastic polymer and a conductive line having conductive liquid metal microparticles dispersed in the matrix, and the passivation layer includes a coating portion coated on the conductive line and containing an elastic polymer. In addition, the present invention relates to a strain sensor using the same flexible electrode circuit and a method of manufacturing the same.

BACKGROUND ART

Soft and flexible electronic devices have attracted attention over the past decade as promising next-generation electronic devices. One of the major technical challenges of flexible electronic devices is to foam flexible circuit lines. Flexible circuit lines require properties such as metal conductivity, negligible resistance change at the time of deformation or mechanical damage, electrical stability under harsh environmental conditions, manufacturing of complex circuit lines, passivation, and good adhesion to elastic substrates.

Various studies have been conducted to obtain high conductivity and high elasticity. A composite in which conductive fillers are embedded in an insulator, which is flexible polymer, may have high elasticity. However, since the distance between the conductive fillers increases with stretching of the composite, there is the unavoidable trade-off between conductivity and flexibility, and rapid resistance change occurs due to the stretching.

Liquid metals have been studied as an alternative to rigid metal conductors due to their unique properties such as flowability, extreme elasticity, and metallic conductivity (34,000 S/cm). However, since an oxide layer ($Ga_2O_3$) famed quickly on the surface of the liquid metal is an insulating material, the electrode composed of the liquid metal is not electrically conductive. Therefore, for the activation of the electrical conduction of the electrode, it is necessary to remove the oxide layer through chemical etching or to destroy the oxide layer through mechanical scratching. In addition, there is a problem that the interaction between the liquid metal and the flexible substrate is extremely poor.

As to future electronic devices, focus is put on planar multilayer induction coils for tactile sensing applications and highly flexible 3D structures such as 3D antenna structures for wireless communication. One of the major technical problems of the electronic device having a three-dimensional structure is that it is difficult for a passive component to separate the lower and upper circuit lines.

Therefore, there is a need for research on a flexible electrode circuit having high elasticity and providing a three-dimensional structure, a device using the same, and a method of manufacturing the same.

DISCLOSURE

Technical Problem

An objective of the present invention is to solve the above problems, thereby providing a flexible circuit electrode exhibiting metal conductivity, negligible change in resistance when defamation or mechanical damage occurs, and excellent adhesion to an elastic substrate.

Another objective of the present invention is to provide a liquid metal-based flexible circuit electrode from which it is not necessary destroy an oxide layer through chemical etching or mechanical scratching.

A further objective of the present invention is to provide a flexible circuit electrode that maintains constant conductivity in a wide temperature range and a wide humidity range and to provide a method of manufacturing the same.

In addition, a yet further objective of the present invention is to provide a strain sensor with a stack of electrodes foamed through 3D circuit printing, and a method of manufacturing the same.

Technical Solution

According to one aspect of the present invention, there is provided a flexible electrode circuit including: a flexible substrate; and an electrode formed on the flexible substrate, in which the electrode includes a conductive line layer and a passivation layer, in which the conductive line layer includes a matrix including an elastic polymer and a conductive line having conductive liquid metal microparticles dispersed in the matrix, and the passivation layer is coated on the conductive line and includes a coating portion having an elastic polymer.

In addition, the flexible electrode circuit is a three-dimensional flexible electrode circuit in which a plurality of the electrodes is stacked, in which a plurality of the conductive line layers and a plurality of the passivation layers may be alternately stacked in multiple layers.

In addition, the coating portion may be continuous in a longitudinal direction of the conductive line and may be positioned in contact with a surface of the conductive line.

In addition, the coating portion may be continuous in a circumferential direction of the conductive line, may be positioned on an exposed surface of the conductive line, and may be positioned in contact with a surface of the conductive line.

In addition, the conductive liquid metal microparticles may be electrically connected to each other.

In addition, each of the conductive liquid metal microparticles includes: a core comprising a liquid metal; and a shell surrounding the core and comprising a hydrogen-doped liquid metal oxide.

In addition, the shell may further include a liquid metal oxide.

In addition, the hydrogen-doped liquid metal oxide may be represented by Chemical Formula 1.

$$M_xO_yH_z \qquad \text{[Chemical Formula 1]}$$

In Chemical Formula 1,
M is a liquid metal,
x is in a range of 0<x≤1,
y is in a range of 0<y≤1, and
z is in a range of 0<z≤1.

In addition, the liquid metal may include at least one selected from the group consisting of gallium (Ga), indium (In), tin (Sn), gold (Au), and alloys thereof.

In addition, the conductive liquid metal microparticles may further include an elastic polymer coupled to the shell and positioned outward.

In addition, each of the conductive line layer, the passivation layer, and the elastic polymer positioned outward may include an ethylene (—C—C—) moiety in a chain thereof.

In addition, each of the conductive line layer, the passivation layer, and the elastic polymer positioned outward may include at least one selected from the group consisting of ethylene-vinyl acetate copolymer (PEVA), styrene-ethylene-butylene-styrene block copolymer (SEBS), and aliphatic polyurethane.

According to another aspect of the present invention, there is provided a strain sensor including: a flexible substrate; a lower electrode famed on the flexible substrate and having a planar spiral shape turning outward from the center in a clockwise direction or a counterclockwise direction; and an upper electrode famed on the lower electrode and having a planar spiral shape turning outward from the center in a direction opposite to the turning direction of the lower electrode. The lower electrode and the upper electrode are electrically connected to each other at the center. Each of the lower and upper electrodes includes: a conductive line layer including a matrix including an elastic polymer and a conductive line having hydrogen-doped liquid metal microparticles dispersed in the matrix; and a passivation layer coated on the conductive line and including a coating portion having an elastic polymer.

In addition, each of the respective passivation layers in the lower and upper electrodes may have a thickness of 1 to 10 μm.

According to another aspect of the present invention, there is provided a method of manufacturing a flexible electrode circuit, the method including: (a) preparing a mixed solution by mixing an elastic polymer, a liquid metal, a radical initiator, and a solvent; (b) preparing a conductive ink containing conductive liquid metal microparticles by treating the mixed solution with ultrasonic waves; and (c) printing the conductive ink on a flexible substrate and thermally annealing the conductive ink to manufacturing the flexible electrode circuit according to claim 1, in which each of the conductive liquid metal microparticles includes a core containing a liquid metal and a shell surrounding the core and containing a hydrogen-doped liquid metal oxide.

In step (c), in a period between the printing and the thermal annealing, a self-passivation phenomenon in which the conductive liquid metal microparticles of the conductive ink move down, and the solvent and the elastic polymer move up may occur.

In addition, the mixed solution may contain 5% to 90% by volume of the liquid metal with respect to 100% by volume of the elastic polymer.

In addition, the thickness of the passivation layer may be controlled by adjusting the parts by weight of the polymer and the liquid metal with respect to the solvent in the mixed solution.

According to a further aspect of the present invention, there is provided a method of manufacturing a strain sensor, the method including: (1) preparing a mixed solution by mixing an elastic polymer, a liquid metal, a radical initiator, and a solvent; (2) preparing a conductive ink containing conductive liquid metal microparticles by treating the mixed solution with ultrasonic waves; (3) forming a lower electrode by printing, with the conductive ink, a clockwise or counterclockwise planar spiral pattern that turns outward from the center and then thermally annealing the printed spiral pattern; and (4) and foaming an upper electrode by printing, with the conductive ink, a planar spiral pattern that starts from the center in the opposite direction to the lower electrode turning outward from the center, and then thermally annealing the printed spiral pattern.

In addition, the manufacturing method of the strain sensor may further include, prior to step (4), (3') removing a coating portion foiled at a center portion of the lower electrode to expose the conductive line at the center portion, in which step (4) may be step (4') of foaming the upper electrode by starting the printing from the center portion at which the exposed conductive line is disposed, when printing the planar spiral pattern turning in the opposite direction to the lower electrode that turns outward from the center, and then thermally annealing the printed spiral pattern.

Advantageous Effects

The flexible circuit electrode of the present invention exhibits metal conductivity, negligible change in resistance when deformation or mechanical damage occurs, and excellent adhesion to an elastic substrate.

In addition, the flexible circuit electrode of the present invention can maintain conductivity without destroying an oxide layer using chemical etching or mechanical scratching because the flexible circuit electrode contains conductive liquid metal microparticles including a hydrogen-doped liquid metal oxide shell.

In addition, the flexible circuit electrode of the present invention can maintain constant conductivity under conditions of a wide temperature range and a wide humidity range.

In addition, since the flexible circuit electrode can be famed through 3D circuit printing, a strain sensor with a stack of electrodes, and a method of manufacturing the same can be provided.

DESCRIPTION OF DRAWINGS

Since the accompanying drawings are for reference in describing exemplary embodiments of the present invention, the technical spirit of the present invention should not be construed as being limited to the accompanying drawings.

BEST MODE

Herein after, examples of the present invention will be described in detail with reference to the accompanying drawings in such a manner that the ordinarily skilled in the art can easily implement the present invention.

The description given below is not intended to limit the present invention to specific embodiments. In relation to describing the present invention, when the detailed description of the relevant known technology is determined to unnecessarily obscure the gist of the present invention, the detailed description may be omitted.

The terminology used herein is for the purpose of describing particular embodiments only and is not intended to limit the scope of the present invention. As used herein, the singular forms "a", "an", and "the" are intended to include the plural fauns as well unless the context clearly indicates otherwise. It will be further understood that the teams "comprise" or "have" when used in this specification specify the presence of stated features, integers, steps, operations, elements and/or combinations thereof, but do not preclude the presence or addition of one or more other features, integers, steps, operations, elements, and/or combinations thereof.

Teams including ordinal numbers used in the specification, "first", "second", etc. can be used to discriminate one component from another component, but the order or priority of the components is not limited by the terms unless specifically stated. These teams are used only for the purpose of distinguishing a component from another component. For example, a first component may be referred as a second component, and the second component may be also referred to as the first component.

In addition, when it is mentioned that a component is "famed" or "stacked" on another component, it should be understood such that one component may be directly attached to or directly stacked on the front surface or one surface of the other component, or an additional component may be disposed between them.

Hereinafter, a flexible electrode circuit that is 3D circuit printable, according to the present invention, a strain sensor using the same, and a manufacturing method thereof will be described in detail. However, those are described as examples, and the present invention is not limited thereto and is only defined by the scope of the appended claims.

Figure 10:
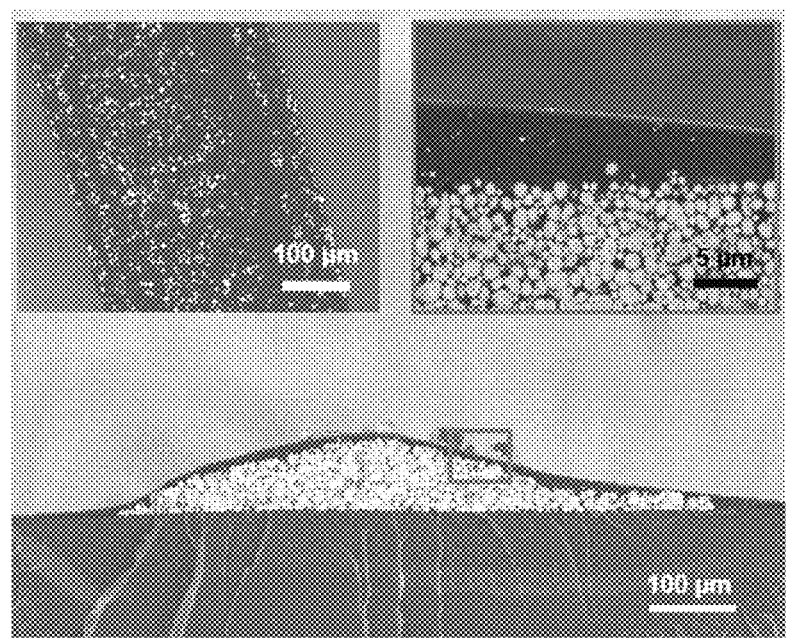
FIG. 10 is a SEM image of a cross section of a flexible electrode printed with the conductive ink of Example 14.

FIG. 10 is an SEM image of a cross section of an electrode in a flexible electrode circuit manufactured according to one embodiment of the present invention.

Referring to FIG. 10, the present invention provides a flexible electrode circuit including: a flexible substrate; and an electrode famed on the flexible substrate. The electrode includes a conductive line layer and a passivation layer. The conductive line layer includes a matrix including an elastic polymer and a conductive line having conductive liquid metal microparticles dispersed in the matrix. The passivation layer is coated on the conductive line and includes a coating portion having an elastic polymer.

In addition, the flexible electrode circuit is a three-dimensional flexible electrode circuit in which a plurality of the electrodes is stacked, in which a plurality of the conductive line layers and a plurality of the passivation layers may be alternately stacked in multiple layers.

In addition, the coating portion may be continuous in a longitudinal direction of the conductive line and may be positioned in contact with a surface of the conductive line.

In addition, the coating portion may be continuous in a circumferential direction of the conductive line, may be positioned on an exposed surface of the conductive line, and may be positioned in contact with a surface of the conductive line.

In addition, the conductive liquid metal microparticles may be electrically connected to each other.

In addition, each of the conductive liquid metal microparticles includes: a core comprising a liquid metal; and a shell surrounding the core and comprising a hydrogen-doped liquid metal oxide.

In addition, the shell may further include a liquid metal oxide.

In addition, the hydrogen-doped liquid metal oxide may be represented by Chemical Formula 1.

$$M_xO_yH_z$$ [Chemical Formula 1]

In Chemical Formula 1,
M is a liquid metal,
x is in a range of 0<x≤1,
y is in a range of 0<y≤1, and
z is in a range of 0<z≤1.

In addition, the liquid metal may include at least one selected from the group consisting of gallium (Ga), indium (In), tin (Sn), gold (Au), and alloys thereof.

In addition, the alloy may include one or more selected from the group consisting of a eutectic gallium-indium alloy (EGaIn) and Galinstan. Preferably, the alloy may include a eutectic gallium-indium alloy.

In addition, the conductive liquid metal microparticles may further include an elastic polymer coupled to the shell and positioned outward.

In addition, each of the conductive line layer, the passivation layer, and the elastic polymer positioned outward may include an ethylene (—C—C—) moiety in a chain thereof. The ethylene moieties may be contained in an amount of 40% to 99% by weight with respect to 100% by weight of the elastic polymer, preferably 60% to 95% by weight, and more preferably 80% to 90% by weight. When the elastic polymer contains less than 40% by weight of the ethylene moieties, hydrogen doping in the oxide on the surface of the liquid metal microparticles is not sufficient. In this case, when it is used as a flexible electrode, it is not desirable because the conductivity of the electrode is low. When the content of the ethylene moieties exceeds 99% by weight, it is not preferable because it is difficult to manufacture a flexible electrode circuit because elasticity is lost.

In addition, each of the conductive line layer, the passivation layer, and the elastic polymer positioned outward may include at least one selected from the group consisting of ethylene-vinyl acetate copolymer (PEVA), styrene-ethylene-butylene-styrene block copolymer (SEBS), and aliphatic polyurethane. Preferably, ethylene-vinyl acetate copolymer may be included.

The conductive liquid metal microparticles may have a diameter of 1 to 10 μm, and preferably a diameter of 3 to 5 μm. When the diameter of the conductive liquid metal microparticles is smaller than 1 μm, it is undesirable because the conductivity is low. When the diameter exceeds 10 μm, the thickness of the shell (liquid metal oxide) is relatively thin compared to the total diameter of the liquid metal microparticles. In this case, there is risk that the liquid metal of the core is damaged or leaked when the shell is treated (i.e., at the time of hydrogen doping), and thus it is difficult to foam the conductive liquid metal microparticles of the present invention. Therefore, such an excessively large diameter is not preferable.

The thickness of the shell may be in a range of 0.5 to 10 nm, preferably a range of 1 to 5 nm, and more preferably a range of 3 to 5 nm. When the thickness of the shell is smaller than 0.5 nm, it is not preferable because the liquid metal microparticles are unstable. When the thickness exceeds 10 nm, the conductivity exhibited by hydrogen doping is insignificant because the thickness of the liquid metal oxide increases. Therefore, such an excessively large thickness is not preferable.

The present invention provides a strain sensor including: a flexible substrate; a lower electrode famed on the flexible substrate and having a planar spiral shape turning outward from the center in a clockwise or counterclockwise direction; and an upper electrode famed on the lower electrode and having a planar spiral shape turning outward from the center in a direction opposite to the turning direction of the lower electrode. The lower electrode and the upper electrode are electrically connected to each other at the center. Each of the lower and upper electrodes includes: a conductive line layer including a matrix including an elastic polymer and a conductive line having hydrogen-doped liquid metal microparticles dispersed in the matrix; and a passivation layer coated on the conductive line and including a coating portion having an elastic polymer.

In addition, the thickness of each of the respective passivation layers in the lower and upper electrodes may be in a range of 1 to 10 μm and preferably a range of 5 to 8 μm. When the thickness of the passivation layer is smaller than 1 μm, it is not preferable because inductance measurement under external pressure cannot be performed so that the function of the strain sensor cannot be performed. Therefore, such a small thickness is not preferable. When the thickness exceeds 10 μm, it is undesirable because the inductance is low and sensitivity to deformation decreases.

The present invention provides a method of manufacturing a flexible electrode circuit, the method including: (a) preparing a mixed solution by mixing an elastic polymer, a liquid metal, a radical initiator, and a solvent; (b) preparing a conductive ink containing conductive liquid metal microparticles by treating the mixed solution with ultrasonic waves; and (c) printing the conductive ink on a flexible substrate and thermally annealing the conductive ink to manufacturing the flexible electrode circuit according to claim 1, in which each of the conductive liquid metal microparticles include a core containing a liquid metal and a shell surrounding the core and containing a hydrogen-doped liquid metal oxide.

In step (c), in a period between the printing and the thermal annealing, a self-passivation phenomenon in which the conductive liquid metal microparticles of the conductive ink move down and the solvent and the elastic polymer move up may occur.

The flexible electrode circuit manufacturing method may further include (d) forming a passivation layer by printing a pattern with an insulator polymer solution or an insulator pre-polymer on the flexible electrode circuit, in which step (d) is performed after step (c).

In the insulator polymer solution, the elastic polymer may include at least one selected from the group consisting of an ethylene-vinyl acetate copolymer (PEVA) and a styrene-ethylene-butylene-styrene block copolymer (SEBS), and the insulator pre-polymer may include at least one selected from the group consisting of polydimethylsiloxane (PDMS) and Ecoflex.

In addition, with respect to 100% by volume of the elastic polymer, the content of the liquid metal may be in a range of 5% to 90% by volume (v/v %), preferably a range of 10% to 40% by volume (v/v %), and more preferably a range of 20% to 30% by volume (v/v %). When the content of the liquid metal is less than 5% by volume, it is not preferable because the conductivity is low. When the content of the liquid metal exceeds 90% by volume, it is not preferable because the effect of increasing the conductivity obtained by increasing the volume percentage of the liquid metal is insignificant.

In addition, the thickness of the passivation layer can be controlled by adjusting the parts by weight of the polymer and the liquid metal with respect to the solvent in the mixed solution.

Step (a) may be performed at a temperature in a range of 70° C. to 100° C. When step (a) is performed at a temperature lower than 70° C., it is not preferable because the radical initiator is not activated whereby radicals are not generated. When the temperature exceeds 100° C., it is not preferable because an addition reaction may occur.

Step (b) may include (b-1) ultrasonically treating the mixed solution to cause the elastic polymer to react with the radical initiator to generate hydrogen radicals (H·) and forming a core including the liquid metal; (b-2) oxidizing the liquid metal on the surface of the core to form a liquid metal oxide surrounding the core; and (b-3) foaming conductive liquid metal microparticles, each having a shell containing a hydrogen-doped liquid metal oxide foamed by bonding of the hydrogen radical (H·) and oxygen of the liquid metal oxide.

Specifically, primary carbon radicals (~C—C·) are generated in the aliphatic segment of the elastic polymer through the ultrasonic treatment, radicals are generated from the radical initiator, and a core containing liquid metal is foamed. The reaction of generating the primary carbon radicals is represented by Reaction Formula 1 below.

[Reaction Formula 1]

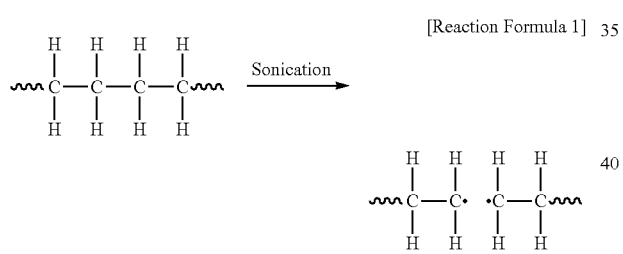

The reaction of generating radicals from the radical initiator is represented by Reaction Formula 2 below.

[Reaction Formula 2]

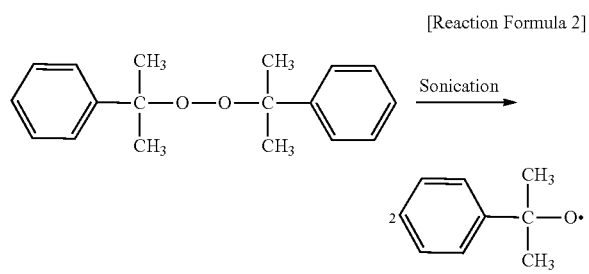

The generated radicals are transferred to the polymer and undergoes β-scission, resulting in the generation of secondary carbon radicals (~C—C·—C~) producing alkene and primary carbon radicals. The reaction of generating the secondary carbon radicals is represented by Reaction Formulas 3 and 4 below.

[Reaction Formula 3]

[Reaction Formula 4]

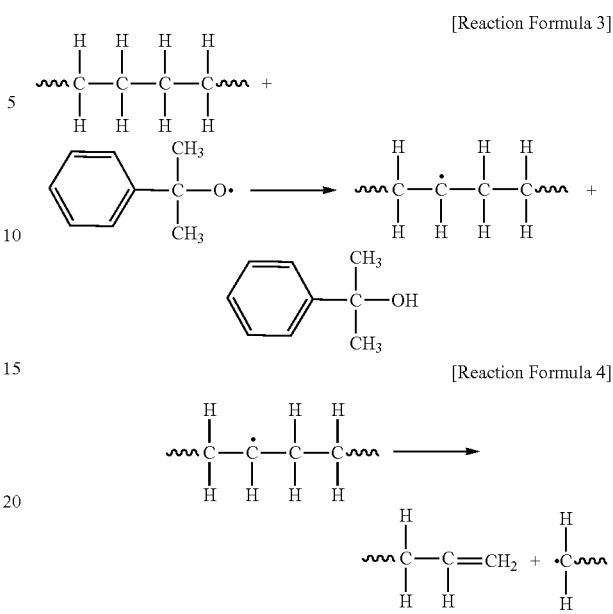

The primary carbon radical is converted into an alkene, thereby producing a hydrogen radical (H·), and the hydrogen radical generation reaction is represented by Reaction Formula 5 below. In this case, the hydrogen radical generation rate can be controlled by adjusting the concentration of the radical initiator.

[Reaction Formula 5]

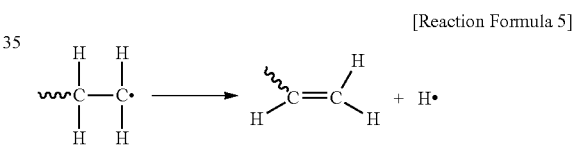

The liquid metal on the surface of the core is oxidized to foil a liquid metal oxide surrounding the core, and the hydrogen radicals bind to oxygen in contained the liquid metal oxide to form a shell containing a hydrogen-doped liquid metal. Thus, conductive liquid metal microparticles having the core and the shell are formed. In this case, to achieve a high hydrogen doping concentration, it is preferable that the elastic polymer contains many ethylene (—C—C—) moieties in the chain thereof. Specifically, an ethylene-vinyl acetate copolymer (PEVA) in which the ethylene moiety accounts for 88% by weight is preferably used.

In addition, the conductive ink preparation method may further include step (b-4) in which the elastic polymer binds to the shell after step (b-3) to foam conductive liquid metal microparticles containing the polymer bonded to the shell. The elastic polymer coupled to the shell of the conductive liquid metal microparticle and positioned outward helps the liquid metal microparticles to stabilize.

Figure 13:
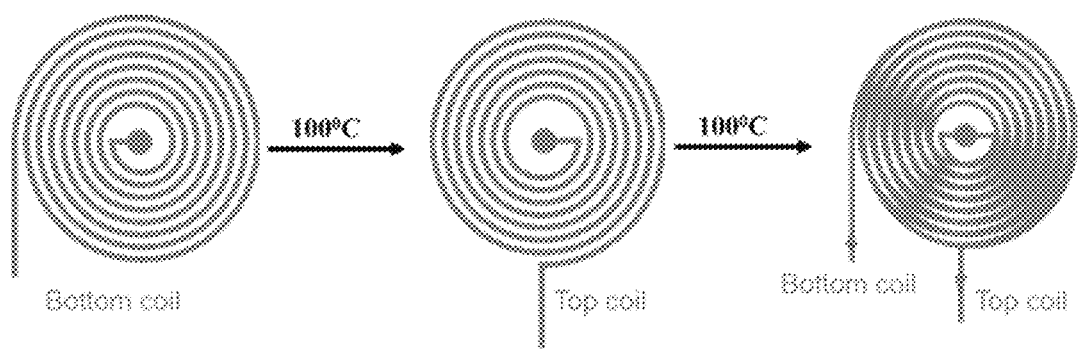
FIG. 13 is a schematic diagram illustrating a method of manufacturing a strain sensor by printing a pattern with a conductive ink according to one embodiment of the present invention.

FIG. 13 is a schematic diagram illustrating a method of manufacturing a strain sensor according to one embodiment of the present invention.

Referring to FIG. 13, the method of manufacturing a strain sensor includes: (1) preparing a mixed solution by mixing an elastic polymer, a liquid metal, a radical initiator, and a solvent; (2) preparing a conductive ink containing conductive liquid metal microparticles by treating the mixed solution with ultrasonic waves; (3) forming a lower electrode by printing, with the conductive ink, a clockwise or counterclockwise planar spiral pattern that turns outward from the center and then thermally annealing the printed spiral pattern; and (4) and foaming an upper electrode by printing, with the conductive ink, a planar spiral pattern that starts from the center in the opposite direction to the lower electrode turning outward from the center, and then thermally annealing the printed spiral pattern.

A passivation layer may be famed by additionally printing a pattern with an insulator polymer solution or an insulator pre-polymer on the lower electrode famed in step (3).

In the insulator polymer solution, the elastic polymer may include at least one selected from the group consisting of an ethylene-vinyl acetate copolymer (PEVA) and a styrene-ethylene-butylene-styrene block copolymer (SEBS), and the insulator pre-polymer may include at least one selected from the group consisting of polydimethylsiloxane (PDMS) and Ecoflex.

In addition, the manufacturing method of the strain sensor may further include, prior to step (4), (3') removing a coating portion famed at a center portion of the lower electrode to expose the conductive line at the center portion, in which step (4) may be step (4') of forming the upper electrode by starting the printing from the center portion at which the exposed conductive line is disposed, when printing the planar spiral pattern turning in the opposite direction to the lower electrode that turns outward from the center, and then thermally annealing the printed spiral pattern.

Mode for Carrying Out the Invention

Example

Hereinafter, a preferred example of the present invention will be described. However, the example is for illustrative purposes, and the scope of the present invention is not limited thereto.

Conductive Ink and Flexible Electrode

Example 1

0.2 g of an ethylene-vinyl acetate copolymer (poly(ethylene-co-vinylacetate (PEVA), manufactured by Sigma-Aldrich) having an ethylene (—C—C—) moiety weight fraction ($\varphi E$) of 0.88, and 4 mg of dicumyl peroxide (DCP, manufactured by Sigma-Aldrich) were dissolved in 5 mL of toluene (toluene 99.5%, manufactured by Samchun) at 80° C. to prepare a solution.

After adding 0.56 g of eutectic gallium-indium alloy (99.99% trace metal standard, manufactured by Sigma-Aldrich) to the solution, followed by sonication using Sonics vibra CV334 (13 mm tip) for 15 minutes whereby a conductive ink containing conductive liquid metal microparticles was prepared.

The conductive ink was printed on a PDMS substrate (manufactured by Dow Corning), using a nozzle printer (Image Master 350PC, manufactured by Musashi). The diameter of the nozzle was 100 μm, and the dispensing pressure was changed in a range of 50 to 100 kPa to control the width of the printed line. After the printing, the solvent was removed through thermal annealing performed at 120° C. for 3 hours to prepare a flexible electrode.

Example 2

A conductive ink and a flexible electrode were prepared in the same manner as in Example 1, except that PEVA having an ethylene moiety weight fraction ($\varphi_E$) of 0.82 was used instead of PEVA having an ethylene moiety weight fraction ($\varphi_E$) of 0.88.

Example 3

A conductive ink and a flexible electrode were prepared in the same manner as in Example 1, except that PEVA having an ethylene moiety weight fraction ($\varphi_E$) of 0.75 was used instead of PEVA having an ethylene moiety weight fraction ($\varphi_E$) of 0.88.

Example 4

A conductive ink and a flexible electrode were prepared in the same manner as in Example 1, except that PEVA having an ethylene moiety weight fraction ($\varphi_E$) of 0.6 was used instead of PEVA having an ethylene moiety weight fraction ($\varphi_E$) of 0.88.

Example 5

A conductive ink and a flexible electrode were prepared in the same manner as in Example 1, except that PEVA having an ethylene moiety weight fraction ($\varphi_E$) of 0.3 was used instead of PEVA having an ethylene moiety weight fraction ($\varphi_E$) of 0.88.

Example 6

A conductive ink and a flexible electrode were prepared in the same manner as in Example 1, except that PEVA having an ethylene moiety weight fraction ($\varphi_E$) of 0.2 was used instead of PEVA having an ethylene moiety weight fraction ($\varphi_E$) of 0.88.

Example 7

A conductive ink and a flexible electrode were prepared in the same manner as in Example 1, except that 0.2 g of polyurethane (4520, manufactured by SMP technology, in Japan) PEVA having an ethylene moiety weight fraction ($\varphi_E$) of 0.5 was used instead of PEVA having an ethylene moiety weight fraction ($\varphi_E$) of 0.88, and 5 mL of tetrahydrofuran (THF, manufactured by Samchun) was used instead of 5 mL of toluene because polyurethane is insoluble in toluene.

Example 8

A conductive ink and a flexible electrode were prepared in the same manner as in Example 1, except that 0.2 g of styrene-ethylene-butylene-styrene block copolymer (SEBS, volume fraction of styrene=30%, manufactured by Ashahi Kasei) having an ethylene moiety weight fraction ($\varphi_E$) of 0.7 was used instead of PEVA having an ethylene moiety weight fraction ($\varphi_E$) of 0.88, and 5 mL of tetrahydrofuran (THF, manufactured by Samchun) was used instead of 5 mL of toluene because SEBS is insoluble in toluene but soluble in THF.

Example 9

A conductive ink and a flexible electrode were prepared in the same manner as in Example 1, except that amount of the eutectic gallium-indium alloy was 0.14 g instead of 0.56 g.

Example 10

A conductive ink and a flexible electrode were prepared in the same manner as in Example 1, except that amount of the eutectic gallium-indium alloy was 0.32 g instead of 0.56 g.

Example 11

A conductive ink and a flexible electrode were prepared in the same manner as in Example 1, except that amount of the eutectic gallium-indium alloy was 0.86 g instead of 0.56 g.

Example 12

A conductive ink and a flexible electrode were prepared in the same manner as in Example 1, except that amount of the eutectic gallium-indium alloy was 1.30 g instead of 0.56 g.

Example 13

A conductive ink and a flexible electrode were prepared in the same manner as in Example 1, except that dicumyl peroxide (DCP, manufactured by Sigma-Aldrich) was not used instead of used.

Example 14

A conductive ink and a flexible electrode were prepared in the same manner as in Example 1, except that 0.3 g of PEVA having an ethylene moiety weight fraction ($\varphi_E$) of 0.82 was used instead of 0.2 g and 0.75 g of eutectic gallium-indium alloy was used instead of 0.56 g.

Comparative Example 1

An ink and an electrode were manufactured in the same manner as in Example 1, except that 5 mL of ethanol (manufactured by Samchun) was used instead of a solution prepared by dissolving 0.2 g of PEVA having an ethylene moiety weight fraction ($\varphi_E$) of 0.88 in 5 mL of toluene.

Comparative Example 2

An ink and an electrode were prepared in the same manner as in Example 1, except that 0.2 g of fluorine silicon rubber (DAL-EL G801, manufactured by Daikin Industries) having an ethylene moiety weight fraction ($\varphi_E$) of 0 was used instead of PEVA having an ethylene moiety weight fraction ($\varphi_E$) of 0.88, and that 5 mL of tetrahydrofuran (THF, manufactured by Samchun) was used instead of 5 mL of toluene.

Comparative Example 3

An ink and an electrode were prepared in the same manner as in Example 1, except that 0.2 g of poly(vinylacetate) (manufactured by Sigma-Aldrich) having an ethylene moiety weight fraction ($\varphi_E$) of 0 was used instead of PEVA having an ethylene moiety weight fraction ($\varphi_E$) of 0.88.

Table 1 below shows the components of each of Examples 1 to 14 and Comparative Examples 1 to 3.

TABLE 1

| Classification | Polymer Type | Ethylene moiety weight fraction | Content (g) | Liquid metal content (g) | Solvent | Use of radical initiator |
|---|---|---|---|---|---|---|
| Example 1 | PEVA | 0.88 | 0.2 | 0.56 | Toluene | ○ |
| Example 2 | PEVA | 0.82 | 0.2 | 0.56 | Toluene | ○ |
| Example 3 | PEVA | 0.75 | 0.2 | 0.56 | Toluene | ○ |
| Example 4 | PEVA | 0.6 | 0.2 | 0.56 | Toluene | ○ |
| Example 5 | PEVA | 0.3 | 0.2 | 0.56 | Toluene | ○ |
| Example 6 | PEVA | 0.2 | 0.2 | 0.56 | Toluene | ○ |
| Example 7 | Polyurethane | 0.5 | 0.2 | 0.56 | THF | ○ |
| Example 8 | SEBS | 0.7 | 0.2 | 0.56 | THF | ○ |
| Example 9 | PEVA | 0.88 | 0.2 | 0.14 | Toluene | ○ |
| Example 10 | PEVA | 0.88 | 0.2 | 0.32 | Toluene | ○ |
| Example 11 | PEVA | 0.88 | 0.2 | 0.86 | Toluene | ○ |
| Example 12 | PEVA | 0.88 | 0.2 | 1.30 | Toluene | ○ |
| Example 13 | PEVA | 0.88 | 0.2 | 0.56 | Toluene | — |
| Example 14 | PEVA | 0.88 | 0.3 | 0.75 | Toluene | ○ |
| Comparative Example 1 | — | — | 0 | — | 0.56 | Ethanol | ○ |
| Comparative Example 2 | Fluorine silicon rubber | 0 | 0.2 | 0.56 | THF | ○ |
| Comparative Example 3 | Poly(vinylacetate) | 0 | 0.2 | 0.56 | Toluene | ○ |

3D Flexible Electrode Circuit Using Conductive Ink

Device Example 1

Figure 12:
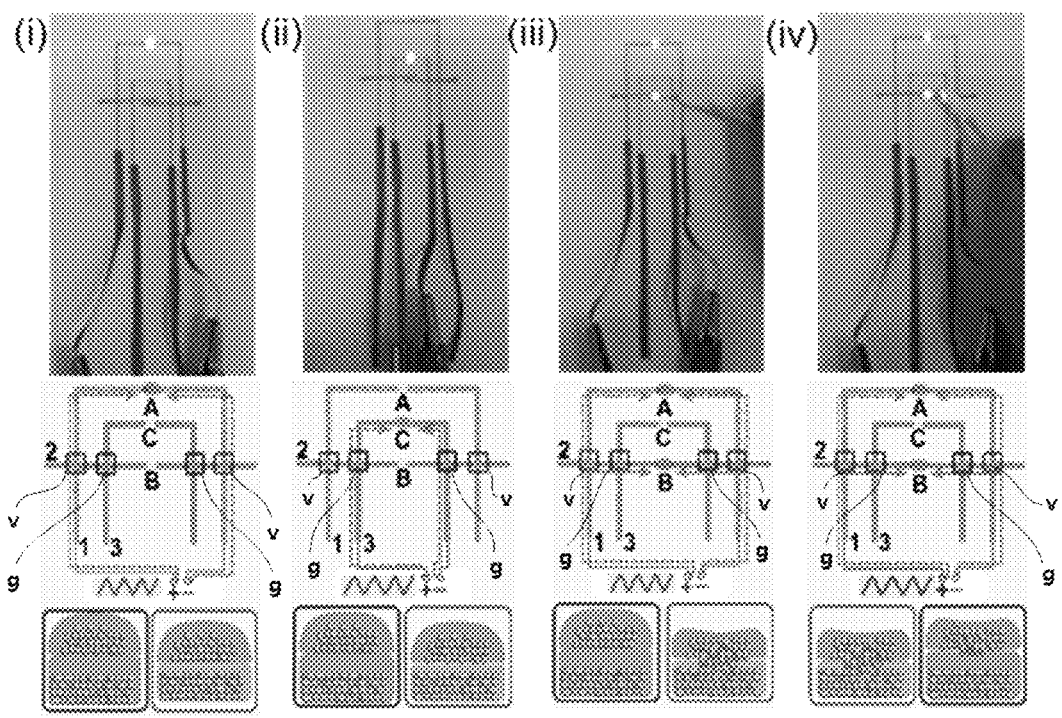
FIG. 12 illustrates a three-dimensional flexible electrode circuit using a flexible electrode printed with a conductive ink according to one embodiment of the present invention, a schematic diagram of the electrode circuit, and a schematic cross-sectional diagram of the flexible electrode at the intersection of the flexible electrodes.

FIG. 12 illustrates a three-dimensional flexible electrode circuit using a flexible electrode printed with a conductive ink according to one embodiment of the present invention, a schematic diagram of the electrode circuit, and a schematic cross-sectional diagram of the flexible electrode at the intersection of the flexible electrodes. A circuit was constructed with reference to FIG. 12.

Specifically, an LED A was connected to the flexible electrode (Line 1) prepared according to Example 1, and an LED C was connected to the flexible electrode (Line 3) which was manufactured according to Example 14 and was not connected to Line 1. An LED B was connected to the flexible electrode (Line 2) prepared according to Example 14 and foiled to intersect Line 1 and Line 3. At the intersection, Line 2 is positioned on Line 1 and Line 3, the intersection of Line 2 and Line 1 is illustrated in a purple box (v), and the intersection of Line 2 and Line 3 is illustrated in a green box (g).

Manufacture of Strain Sensor

Device Example 2

FIG. 13 is a schematic diagram illustrating a method of manufacturing a strain sensor according to one embodiment of the present invention. A strain sensor was manufactured with reference to FIG. 13.

Specifically, a nozzle printer, Image Master 350PC manufactured by Musashi, was used to print a planar spiral pattern having a diameter of 20 mm with 9 outward counterclockwise turns having a width of 500 μm and a height of 90 μm, with the conductive ink prepared according to Example 14. The pattern was printed on a DDMS substrate (manufactured by Dow Corning). After the printing, the pattern underwent thermal annealing at 120° C. for 3 hours, thereby manufacturing a lower electrode. The lower electrode includes a conductive line layer and a passivation layer. The conductive line layer includes a conductive line which is composed of a matrix containing an elastic polymer (PEVA) and liquid metal microparticles dispersed in the matrix. The passivation layer includes a coating portion coated on the conductive line and having an elastic polymer (PEVA).

The coating portion famed in the center of the lower electrode was removed by scraping with the use of tweezers to allow the liquid metal microparticles in the center of the lower electrode to leak.

Printing was performed with the conductive ink prepared according to Example 12 to foam a planar spiral pattern with turns turning outward from the center in a direction opposite to the direction of the lower electrode. The printing was started from the center of the pattern and performed through 9 times of rotation. The pattern had a diameter of 20 mm, a width of 500 μm, and a height of 90 μm. Next, the printed pattern underwent 120° C. thermal annealing for 3 hours. Thus, an upper electrode was manufactured. The upper electrode included a conductive line layer and a passivation layer. The conductive line layer included a matrix containing elastic polymer (PEVA) and a conductive line having hydrogen-doped liquid metal microparticles dispersed in the matrix. The passivation layer included a coating portion coated on the conductive line and containing elastic polymer.

Experimental Example

Experimental Example 1 Verification of Hydrogen Doping of Liquid Metal Oxide

Experimental Example 1-1: Verification of Hydrogen Doping Using XPS Spectrum

Figure 1:
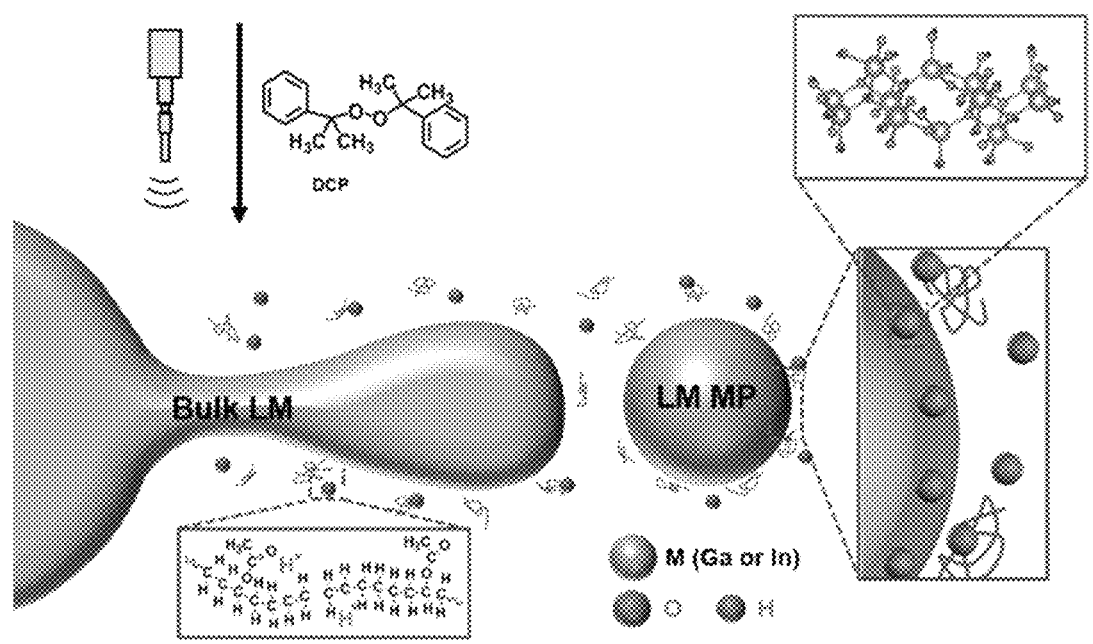
FIG. 1 illustrates a sequence of steps of preparing a conductive ink according to one embodiment of the present invention.
Figure 2:
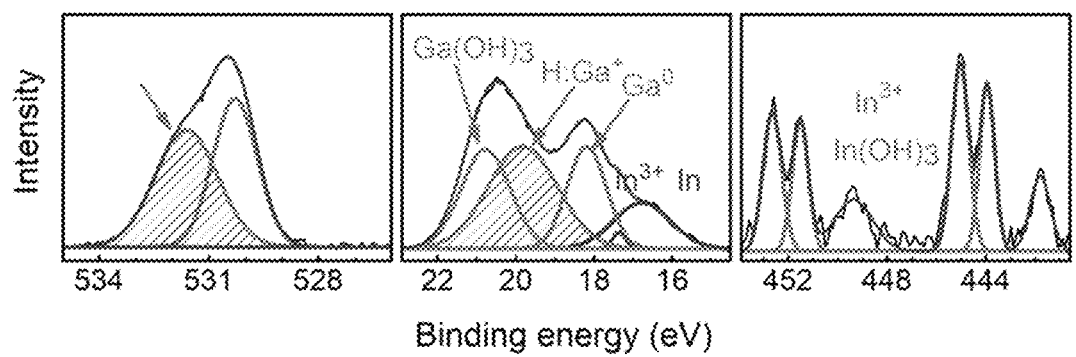
FIG. 2 illustrates a high-resolution XPS spectrum (O 1s, Ga 3d, In 3d) of liquid metal microparticles in Example 1.

FIG. 2 illustrates a high-resolution XPS spectrum (O 1s, Ga 3d, In 3d) of liquid metal microparticles in the ink of Example 1. Specifically, spectra of high-resolution X-ray photoelectron spectroscopy (XPS) of O 1s, Ga 3d, and In 3d were obtained after washing the liquid metal microparticles of the ink of Example 1. Peaks were deconvolved using a Gaussian-Lorentzian method.

Referring to FIG. 2, in the O 1s spectrum (the diagram located on the left in FIG. 2), the hydrogen-doped liquid metal microparticles exhibited a broad beak at 531.7 eV corresponding to $O^{2-}$ of metal hydroxides ($-M(OH)_x$) derived from $M(OH)_3$ on the oxide surface of the oxide and MOH derived from the inside of the oxide. Although hydroxide ($M(OH)_3$) on the surface are an insulating material, protonated MOH is known to increase the conductivity of a metal oxide. The fractions of oxygen (O) to hydroxide and oxide were found to be 52% and 48%, respectively. No O 1s peak was observed in the acetate group (C—O—C═O) of PEVA, which must appear at higher binding energies (533.2 eV and 534.6 eV), indicating that the amount of PEVA adsorbed to the oxide is small.

In addition, in the In 3d spectrum (a diagram located on the right in FIG. 2), the peaks corresponding to $In(OH)_x$ appeared at 445 eV and 452.6 eV.

In addition, in the Ga 3d spectrum (a diagram located in the middle in FIG. 2), the peaks ($Ga^+$, $Ga^{3+}$, $In^{3+}$) in the range of 19 to 22 eV are contributed by the hydroxides. The peaks can be deconvoluted with the surface oxide contribution ($-Ga(OH)_3$, 20.8 eV) and the hydrogen doping contribution (GaOH). The XPS results showed that the oxygen fraction in the hydrogen doped state (GaOH) was 15.8%, which indicates that the atomic concentration of $H^+$ was 7.0 at %.

Experimental Example 1-2: Verification of Hydrogen Doping Using APT Spectrum

Figure 3A:
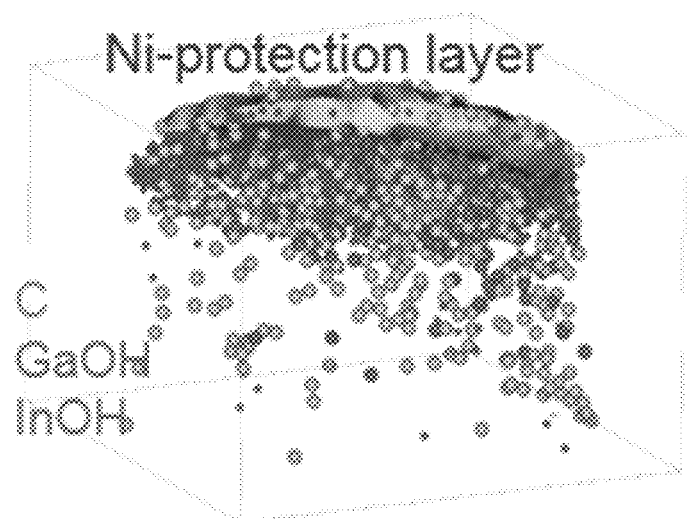
FIG. 3A illustrates an APT element distribution on the conductive liquid metal microparticle in Example 1.
Figure 3B:
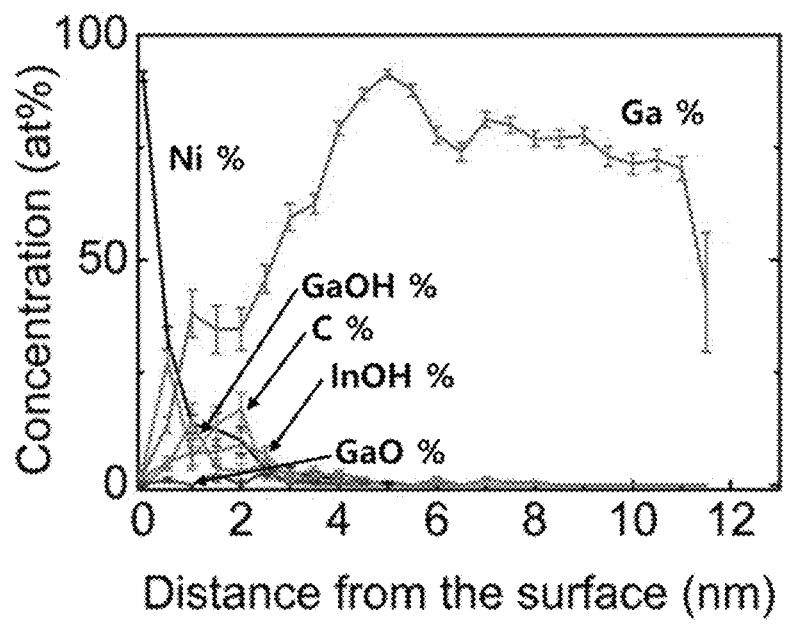
FIG. 3B illustrates an APT element profile of C, GaO, GaOH, and InOH on the conductive liquid metal microparticle in Example 1.

FIG. 3A shows the APT element distribution on the surface of the conductive liquid metal microparticles in Example 1, and FIG. 3B shows the APT element profiles of C, GaO, GaOH, and InOH on the surface of the conductive liquid metal microparticles in Example 1.

Figure 4A:
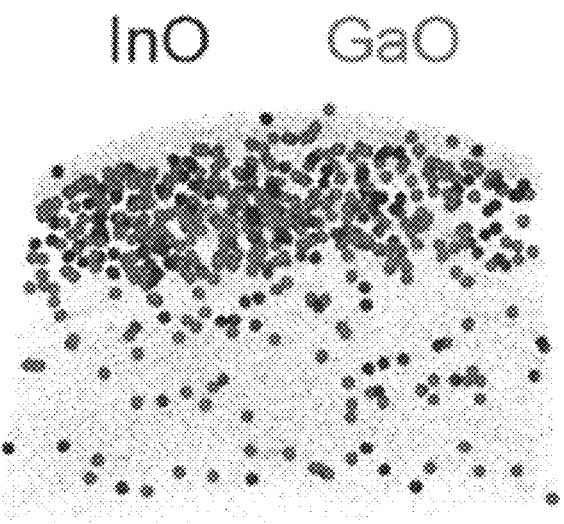
FIG. 4A illustrates an APT element distribution on a conductive liquid metal microparticle in Comparative Example 1.
Figure 4B:
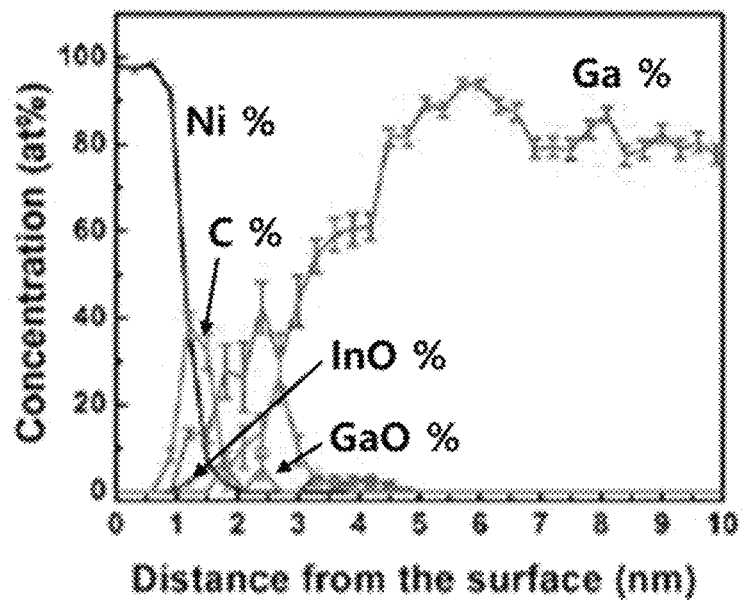
FIG. 4B illustrates an element profile of the conductive liquid metal microparticle in Comparative Example 1.

FIG. 4A shows the APT element distribution on the surface of the liquid metal microparticles in Comparative Example 1, and FIG. 4B shows an element profile on the surface of the liquid metal microparticles in Comparative Example 1.

APT analysis was performed in a manner described below. First, the inks prepared according to Example 1 and Comparative Example 1 were diluted with 10 mL of toluene and vortexed for 2 minutes, followed by settling for 30 minutes. Next, the supernatant was removed. This washing process was repeated three times to remove the polymer, and the precipitated liquid metal microparticles were diluted with 10 mL of toluene and applied on a Si wafer through spin coating. Ni was deposited on the surface of the microparticles to prevent local heating of a sample during laser irradiation for measurement, whereby a sample for APT analysis using a focused ion beam was obtained. The sample was transported to an APT tip, and APT analysis was performed on the sample.

Referring to FIGS. 3A and 3B, it is found that a significant amount of carbon was detected on the surface of the conductive liquid metal microparticles of the conductive ink prepared according to Example 1, indicating that the surface of the microparticles with PEVA. In addition, it can be confirmed that gallium oxide (GaOH) and indium oxide (InOH) are dominant in a surface region (<3 nm) of the shell, and the concentration of GaO is lower than that of GaOH. This means that hydrogen doping extensively occurs on the liquid metal oxide surface.

Referring to FIGS. 4A and 4B, when PEVA is not used for the production of liquid metal microparticles, GaO is detected only in the surface region where GaOH and InOH are not present at all, indicating there is no hydrogen doping on the surface.

Figure 5:
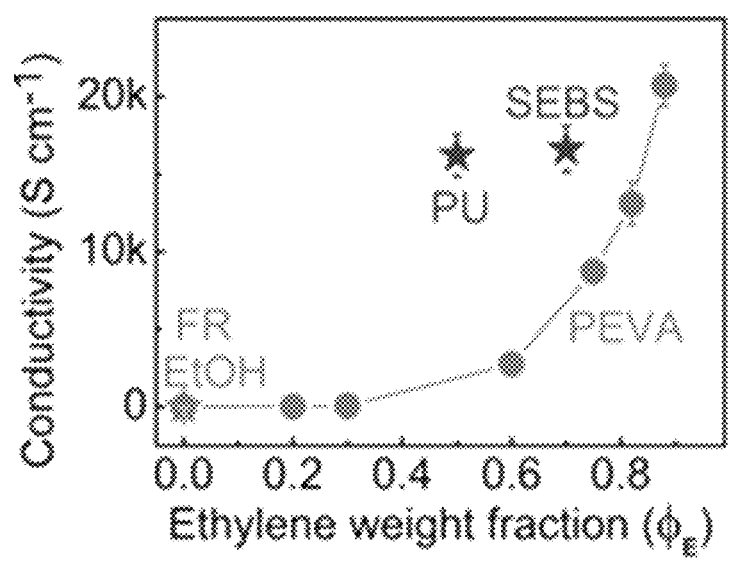
FIG. 5 illustrates the conductivity of each of the flexible electrodes printed with the use of the respective conductive inks of Examples 1 to 8 and Comparative Examples 1 to 3.

Experimental Example 2 Conductivity Analysis According to Ethylene Weight Fraction FIG. 5 illustrates the conductivity of each of the flexible electrodes printed with the respective conductive inks of Examples 1 to 8 and Comparative Examples 1 to 3. Specifically, in order to identify the relationship between the degree of hydrogen doping and the chemical process of an elastic polymer containing ethylene moieties derived from a radical initiator, conductive inks were prepared using polymers having different weight fractions wt % of ethylene moiety, patterns were prepared with the respective conductive inks to evaluate the conductivity of each conductive ink.

Referring to FIG. 5, when pure polyvinyl acetate is used (Comparative Example 3), it is confirmed that the conductivity of the conductive ink is at a noise level due to the insulating $Ga_2O_3$ surface layer. As the weight fraction ($\varphi_E$) of the ethylene moiety increases, the conductivity increases. In addition, it is confirmed that the conductivity of Example 1 ($\varphi_E$=0.88) having the highest ethylene moiety fraction is highest, for example, σ=25,000 cm$^{-1}$.

In addition, FIG. 5 shows the conductivity for each of the cases where other polymers such as fluorine silicone rubber containing a negligible hydrogen fraction ($\varphi_E$=0, Comparative Example 2), polyurethane ($\varphi_E$=0.5, Example 7), and a styrene-ethylene-butylene-styrene copolymer ($\varphi_E$=0.7, Example 8) were dissolved in tetrahydrofuran (THF).

Comparative Example 2 containing fluorine silicone rubber was non-conductive, whereas Example 7 containing polyurethane and Example 8 containing SEBS contained PEVA exhibit the conductivity similar to that of Example 1 and Example 2 both of which contains PEVA having an ethylene moiety weight fraction ($\varphi_E$) of 0.8 or more. Specifically, Example 1 contains PEVA having an ethylene moiety weight fraction ($\varphi_E$) of 0.88 and Example 2 contains PEVA having an ethylene moiety weight fraction ($\varphi_E$) of 0.82. These results indicate that hydrogen doping is the key to achieving high conductivity.

Experimental Example 3 Confirmation of Conductivity

Figure 6:
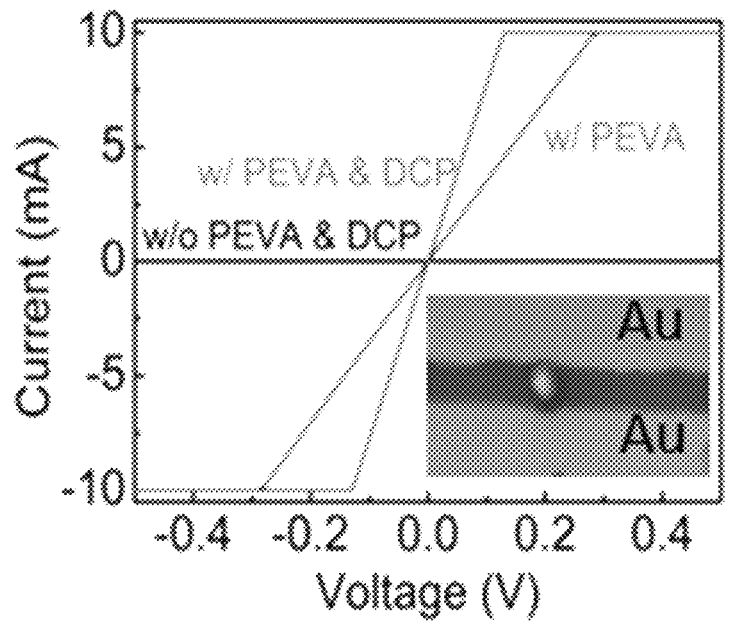
FIG. 6 illustrates I-V graphs when liquid metal microparticles are positioned between gold (Au) pattern lines in the conductive inks of Example 1, Example 13, and Comparative Example 1.

FIG. 6 illustrates I-V graphs when liquid metal microparticles are positioned between gold (Au) pattern lines in Example 1 (w/PEVA and DCP), Example 13 (w/PEVA), and Comparative Example 1 (w/o PEVA and DCP).

Specifically, the inks prepared according to Example 1 (w/PEVA and DCP), Example 13 (w/PEVA), and Comparative Example (w/o PEVA and DCP) were diluted with 10 mL of toluene and vortexed for 2 minutes, followed by settling for 30 minutes. Next, the supernatant was removed. This washing process was repeated three times to remove the polymer, and the precipitated liquid metal microparticles were diluted with 10 mL of toluene to place a single liquid metal microparticle between gold pattern lines, and then the conductivity was measured.

Referring to 6, Example 1 in which liquid metal microparticles were prepared using an elastic polymer (PEVA) and a radical initiator (DCP) exhibited the highest conductivity, and Example 13 in which liquid metal microparticles were prepared using only an elastic polymer (PEVA) exhibited relatively high conductivity although the conductivity of Example 13 is lower than that of Example 1. On the other hand, it was confirmed that Comparative Example 1 in which liquid metal microparticles were prepared without using an elastic polymer (PEVA) and a radical initiator (DCP) was an electrically insulator.

Experimental Example 4 SEM Analysis

Figure 7A:
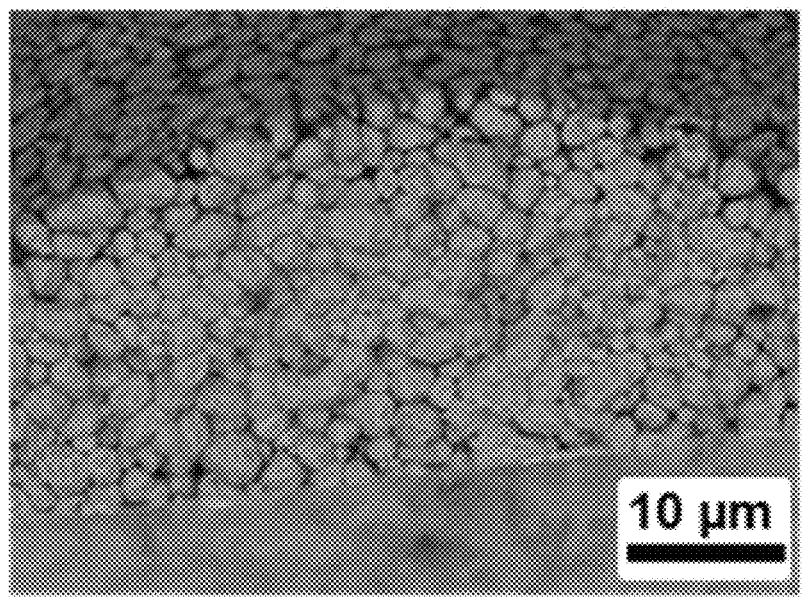
FIG. 7A is a cross-sectional SEM image of a flexible electrode printed with the conductive ink of Example 1.
Figure 7B:
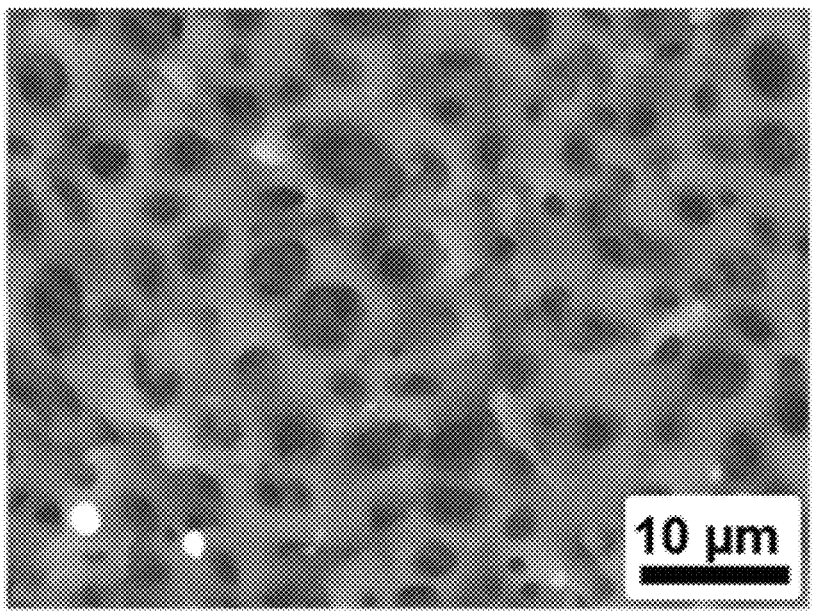
FIG. 7B is a cross-sectional SEM image of a flexible electrode that is printed with the conductive ink of Example 1 and then undergoes HCl etching.
Figure 7C:
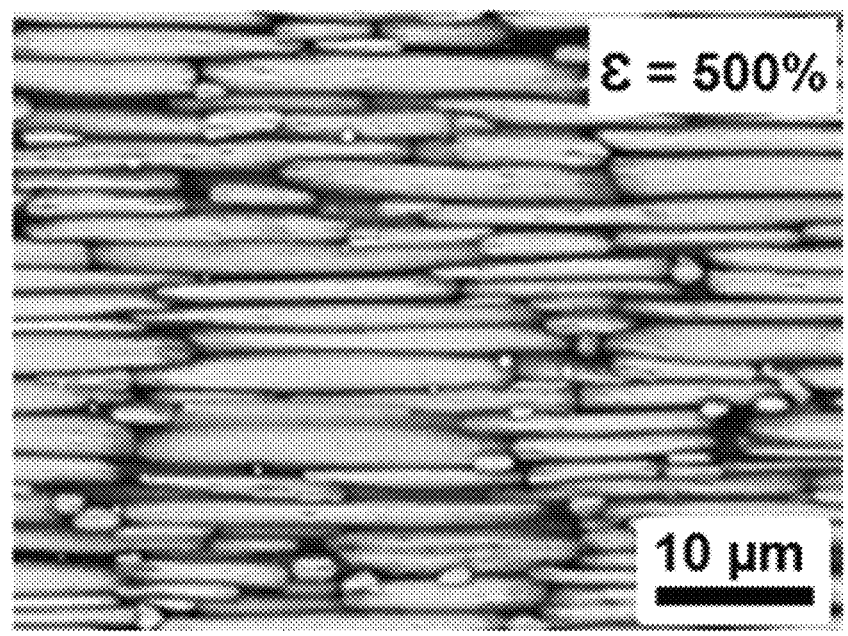
FIG. 7C is a SEM image of the upper surface of an electrode when a flexible electrode printed with conductive ink is uniaxially stretched by 500%.

FIG. 7A is a SEM image of a cross section of a flexible electrode printed with the conductive ink of Example 1. FIG. 7B is a SEM image of a cross section of a flexible electrode that is printed with the conductive ink of Example 1 and then undergoes HCl etching. FIG. 7C is a SEM image of the upper surface of an electrode when a flexible electrode printed with conductive ink is uniaxially stretched by 500%.

Referring to FIG. 7A, it was confirmed that, in the flexible electrode made of a conductive ink, conductive liquid metal microparticles are vertically stacked on the substrate to increase the contact area between the microparticles and are slightly deformed.

Referring to FIG. 7B, it was confirmed that the conductive liquid metal microparticles are three-dimensionally interconnected through the continuously extending space to form a two-component continuous structure with a PEVA matrix.

Referring to FIG. 7C, it was confirmed that the conductive liquid metal microparticles do not agglomerate and recover to their original shape when the strain is removed even after 1,000 cycles. Such a reversible shape change is allowed due to the elastic property of PEVA. Since the conductive ink of the present invention includes an elastic polymer, when the conductive ink is applied on an elastic polymer substrate (PDMS or Ecoflex) through printing to form a flexible electrode, and the force of defaming the famed flexible electrode is applied, it is confirmed that the flexible electrode dynamically deforms.

Figure 8A:
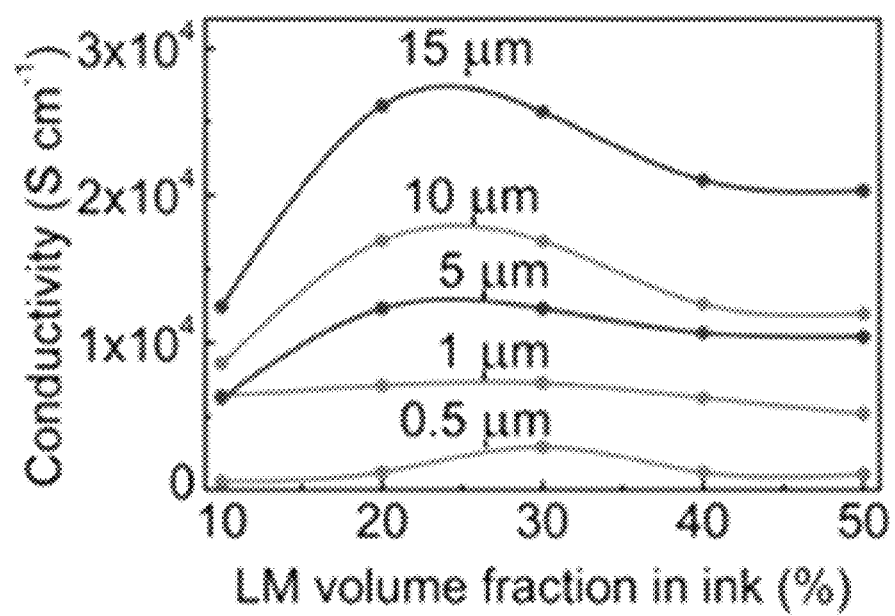
FIG. 8A illustrates the conductivity according to the size of the liquid metal microparticles of Example 1 and Examples 9 to 12.

Experimental Example 5 Conductivity According to Volume Fraction and Size of Liquid Metal Microparticles FIG. 8A illustrates the conductivity according to the size of the liquid metal microparticles of Example 1 and Examples 9 to 12. Specifically, the ultrasonic treatment time was set to 5 minutes, 10 minutes, 15 minutes, 30 minutes, and 120 minutes to control the size of the liquid metal microparticles in the conductive ink. When such ultrasonic treatment times were set, the sizes of the liquid metal microparticles were 0.5 μm, 1 μm, 5 μm, 10 μm, and 15 μm, respectively.

Referring to FIG. 8A, when the volume fraction of the conductive liquid metal microparticles is the same, it can be confirmed that the conductivity of the flexible electrode printed with the conductive ink increases according to the size of the conductive liquid metal microparticles. Specifically, it can be confined that the highest conductivity (2,500 Scm$^{-1}$) is achieved when the conductive ink contains conductive liquid metal microparticles with a diameter of 15 μm. This is because the contact area between the liquid metal microparticles increases and the number of contacts decreases as the size of the liquid metal microparticles increases.

In addition, the maximum conductivity was obtained when the volume fraction of the conductive liquid metal microparticles was in a range of 20% to 30%, indicating that there is a tradeoff between the content of the liquid metal in the conductive ink and the hydrogen doping efficiency of the liquid metal. It can be confirmed that more liquid metal in the conductive ink results in overall higher conductivity, but hydrogen doping is not enough with a small amount of PEVA.

Figure 8B:
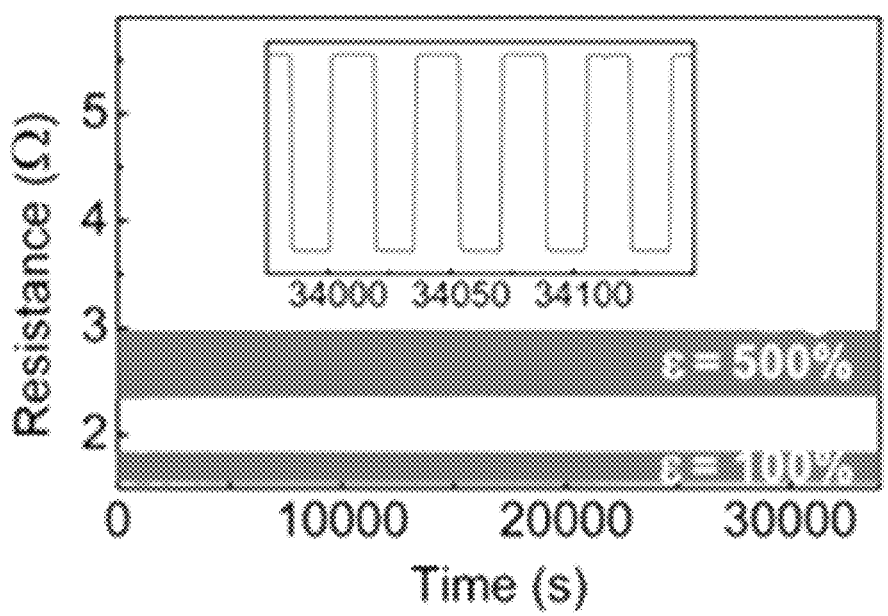
FIG. 8B illustrates change in resistance when the flexible electrode printed with the conductive ink of Example 1 is repeatedly uniaxially stretched for 1,000 cycles at strains (ε) of 100% and 500%.
Figure 8C:
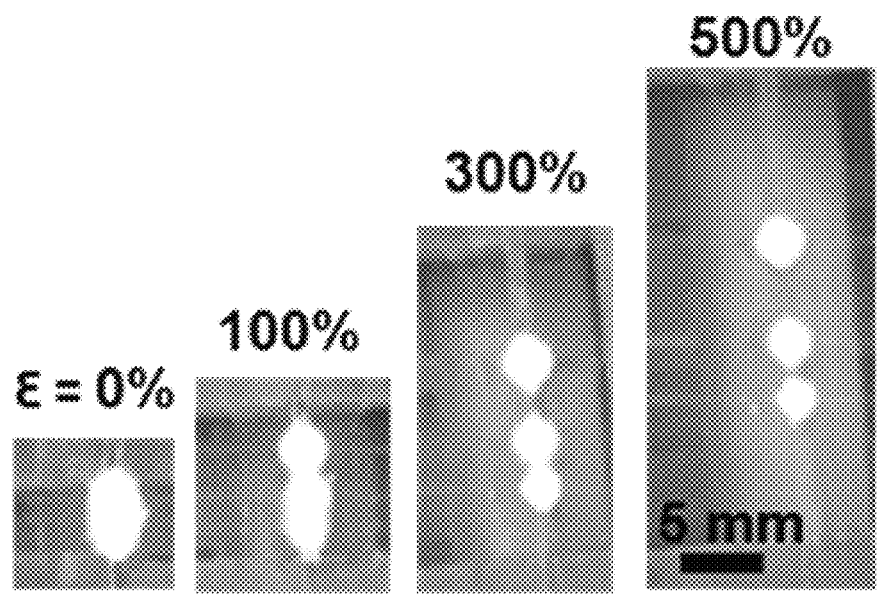
FIG. 8C illustrates a state in which a flexible electrode printed with the conductive ink of Example 1 is connected to an LED and is then uniaxially stretched at various strains.

Experimental Example 6 Resistance Change During Repeated Stretching of Electrode Line Formed with Conductive Ink FIG. 8B illustrates change in resistance when the flexible electrode printed with the conductive ink of Example 1 is repeatedly uniaxially stretched for 1,000 cycles at strains (ε) of 100% and 500%. FIG. 8C illustrates a state in which a flexible electrode printed with the conductive ink of Example 1 is connected to an LED and is then uniaxially stretched at various strains.

Referring to FIG. 8B, it is confirmed that the electrode line printed with the conductive ink of Example 1 exhibits a negligible change in resistance while uniaxial stretching is performed for 1,000 cycles at strains (ε) of 100% and 500%. In addition, the graph in FIG. 8B is an enlarged view of resistance change when the flexible electrode printed with the conductive ink of Example 1 is uniaxially stretched 1,000 times at a strain (ε) of 500%, and the same resistance curve is shown.

Specifically, FIG. 8C shows the change in LED luminance (intensity of light) according to the strain when an LED is attached between two flexible electrodes printed with the conductive ink of Example 1. Referring to FIG. 8C, it is confined that the luminance (intensity of light) is constant when the strain ε changes from 0% to 500%.

Experimental Example 7 Test of Cutting Electrode Line Famed from Conductive Ink

Figure 9A:
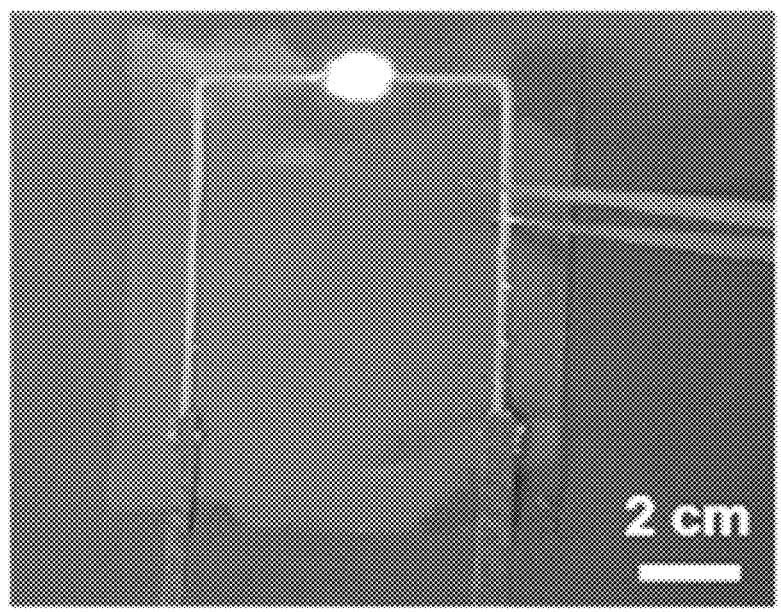
FIG. 9A is a photograph of a state in which a flexible electrode printed with the conductive ink of Example 1 is scratched with tweezers.
Figure 9B:
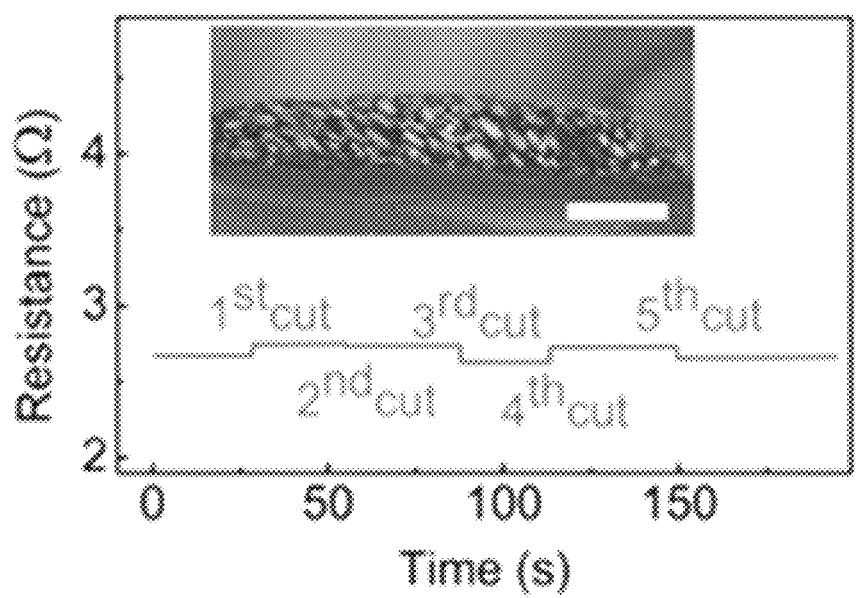
FIG. 9B illustrates change in resistance when a flexible electrode printed with the conductive ink of Example 1 is cut with a sharp razor blade, and an image in FIG. 9B is a SEM image (scale bar=50 μm) of a cross section of the flexible electrode that is cut with the sharp razor blade.
Figure 9C:
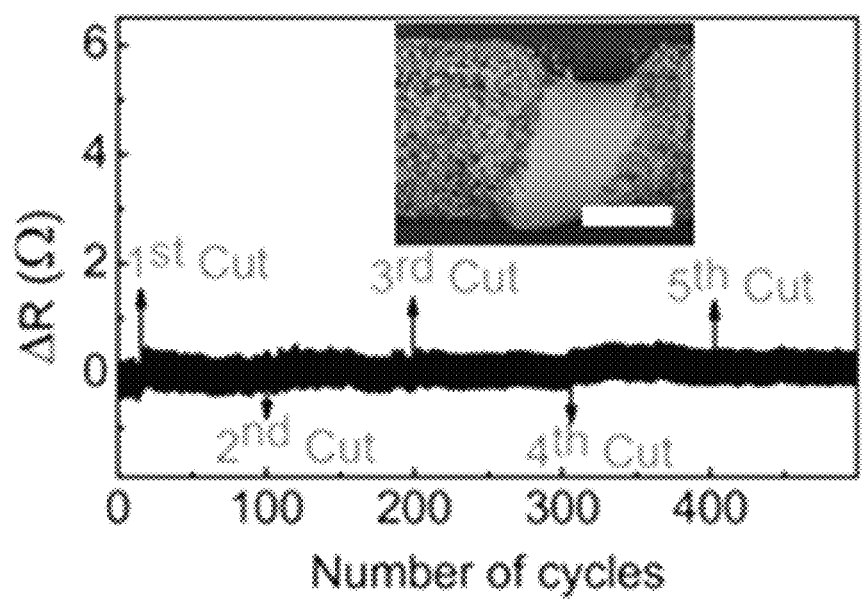
FIG. 9C illustrates change in resistance when a flexible electrode printed with the conductive ink of Example 1 is bluntly cut with tweezers and is repeatedly stretched at a strain (ε) of 100%, and an image in FIG. 9C is a SEM image (scale bar=250 μm) of a cross section of the flexible electrode that undergoes both the cutting and the repeated stretching.

FIG. 9A is a photograph of a state in which a flexible electrode formed, through printing, from the conductive ink of Example 1 is scraped with tweezers, and FIG. 9B illustrates resistance change during a period in which a flexible electrode famed, through printing, from the conductive ink of Example 1 is cut with a sharp razor blade. FIG. 9B shows a cross-sectional SEM image (scale bar=50 μm) of a flexible electrode that is cut with a razor blade. FIG. 9C shows resistance change when a flexible electrode formed, through printing, from the conductive ink of Example 1 is blunt cut with tweezers and is repeatedly stretched (ε=100%) at the same time. FIG. 9C shows a cross-sectional SEM image (scale bar=250 μm) of a flexible electrode when the cutting and repeated stretching were performed at the same time.

Recently, electrical self-healing has attracted interest in realizing elastic circuit lines. However, a key requirement for deformable electronic devices is electrical connections that are difficult to cut, rather than curing broken lines. Therefore, a flexible electrode foamed, through printing, from the conductive ink prepared according to Example 1 was connected to an LED, and then a cutting test was performed in which the flexible electrode was cut with a sharp razor blade and with blunt tweezers.

Referring to FIGS. 9A and 9B, it is confirmed that the electrical resistance of the LED and the light intensity remain unchanged during repeated cutting. When looking at the cross-sectional SEM image of the flexible electrode after the flexible electrode is cut with a sharp razor blade, it is confirmed that the conductive liquid metal microparticles maintain their initial shape without being damaged.

Referring to FIG. 9C, when an electrode line made of the conductive ink of Example 1 is blunt cut with large tweezers, the conductive liquid metal microparticles are ruptured, and the liquid metal constituting the core of the microparticle leaks, thereby forming a continuous liquid metal line, resulting in a minimum resistance change.

Experimental Example 8 Confirmation of Formation of Passivation Layer

FIG. 10 is a SEM image of a cross section of a flexible electrode printed with the conductive ink of Example 14.

Referring to FIG. 10, when printing is performed with a conductive ink containing a liquid metal and an excess amount of an elastic polymer with respect to a solvent, followed by thermal annealing at 120° C., an excess of PEVA is deposited on the top due to a lower density than the liquid metal, thereby foaming a passivation layer containing PEVA.

Experimental Example 9 Stability of Flexible Electrode

Figure 11A:
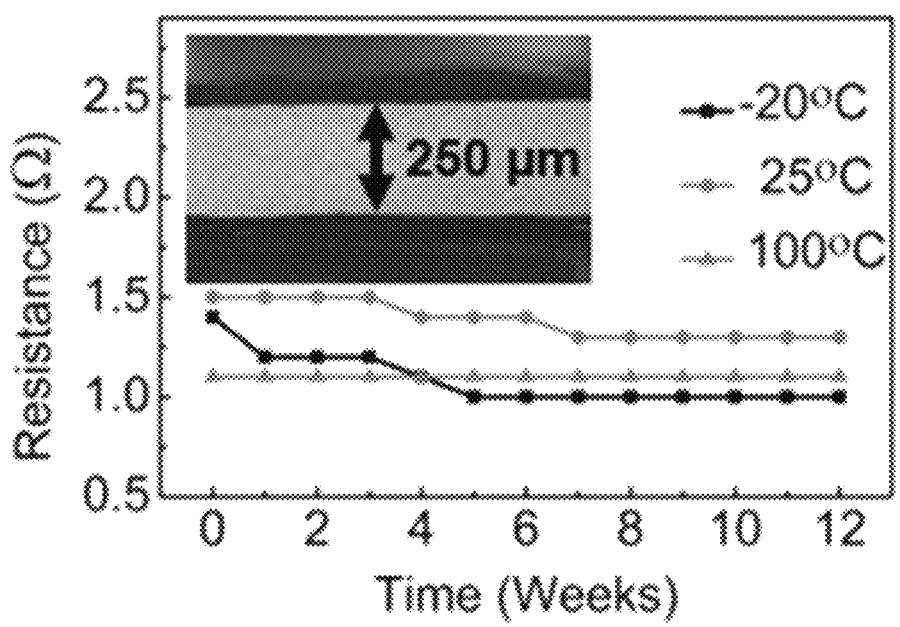
FIG. 11A illustrates change in resistance of the flexible electrode printed with the conductive ink of Example 14, in which the resistance change is observed at temperatures of −20° C., 25° C., and 100° C. for 12 weeks.
Figure 11B:
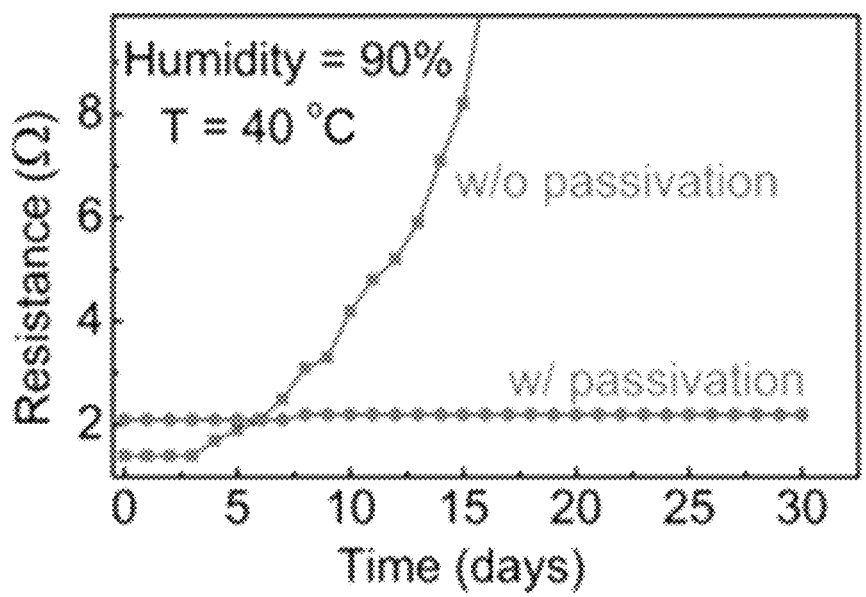
FIG. 11B illustrates change in resistance of the electrodes printed with inks of Example 14 and Comparative Example 1, in which the resistance change is observed at 90% moisture for 30 days.

FIG. 11A shows resistance change of the flexible electrode of Example 14 at various temperatures (−20° C., 25° C., 100° C.) for 12 weeks, and FIG. 11B shows resistance change of the electrode (without passivation layer) of Comparative Example 1 and the electrode (with passivation layer) of Example 14 for 30 days at 90% moisture.

Referring to FIG. 11A it is confirmed that the flexible electrode prepared according to Example 14 exhibits excellent thermal stability in a wide temperature range of −20° C. to 100° C. There is no change in the resistance of the flexible electrode prepared according to Example 14 at 100° C. for 12 weeks. This means that oxidation no longer occurs at high temperature. It is confirmed that the resistance is slightly high at −20° C. but is stabilized after 4 weeks. This may be because the contact between liquid metal microparticles is improved by joule heating that may occur during measurement.

FIG. 11B shows the resistance change according to the presence and absence of the passivation layer at 40° C. and 90% moisture. In the case of Comparative Example 1 in which a passivation layer is not present, the resistance was not changed for early 4 days, but gradually increased. It is confirmed that the conductivity was lost after 20 days. On the other hand, it was confirmed that the resistance of Example 14 in which the passivation layer is present did not show a change in resistance during the entire measurement period (30 days).

Therefore, it is seen that the flexible electrode of the present invention in which the passivation layer is present exhibits excellent electrical stability in mechanical, thermal, and moisture environments.

Experimental Example 10 Characteristics of 3D Circuit Foamed Using Flexible Electrode FIG. 12 illustrates a three-dimensional flexible electrode circuit manufactured according to Device Example 1, a schematic diagram thereof, and an on/off phenomenon according to application of a voltage. Specifically, it is shown how a complicated three-dimensional connection can be designed without electrical crosstalk between stacked flexible electrodes by changing the thickness of the passivation layer.

Referring to FIG. 2, when a voltage of 3 V is applied to Line 1 and Line 3, it is shown that LED A and LED C are turned on ((i) and (ii) in FIG. 12). When a force is applied to the intersection point (purple box (v)) between Line 1 and Line 2 while a voltage is applied to Line 1, it is shown that LED B is turned on due to the vertical connection at the intersection point ((iii) in FIG. 12). When a force is applied to the intersection point (green box (G)) between Line 1 and Line 3 while a voltage is applied to Line 1, it is shown that LED C is not turned on due to a thick passivation layer (having a thickness of about 5 μm) of Line 2 ((iv) in FIG. 12).

Therefore, it is possible to manufacture a complicated three-dimensional flexible circuit without electrical crosstalk due to a passivation layer controlled by adjusting the weight parts of polymer and liquid metal when manufacturing the flexible electrode of the present invention.

Experimental Example 11 Mechanical Characteristics of Strain Sensor

Figure 14:
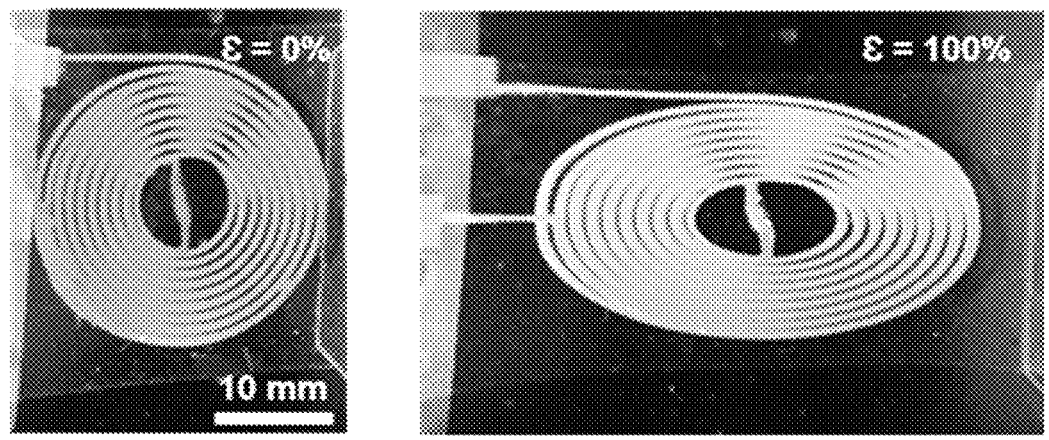
FIG. 14 shows images at 0% strain (ε) and 100% strain (ε) of Device Example 2.
Figure 15A:
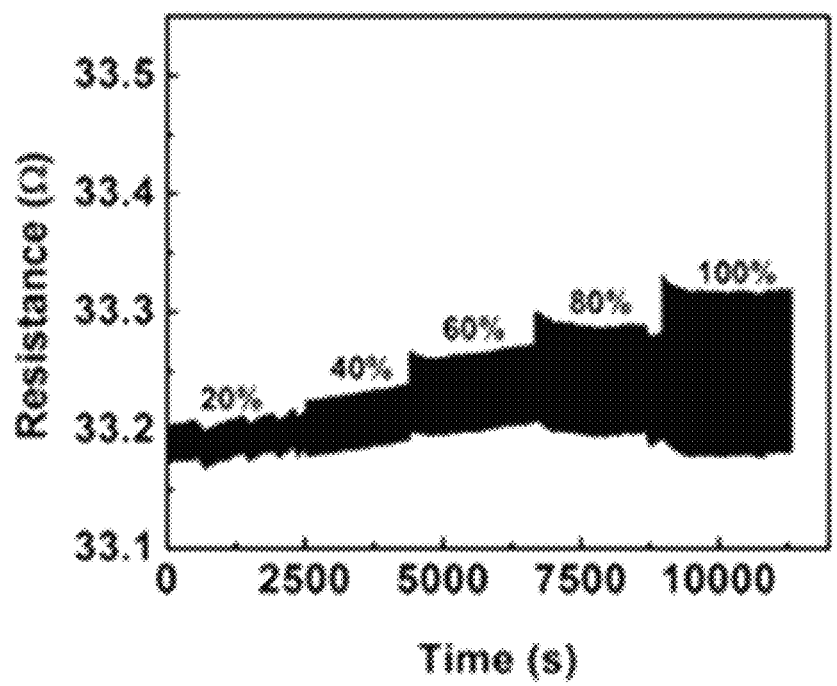
FIG. 15A shows change in resistance during repeated uniaxial stretching of Device Example 2.
Figure 15B:
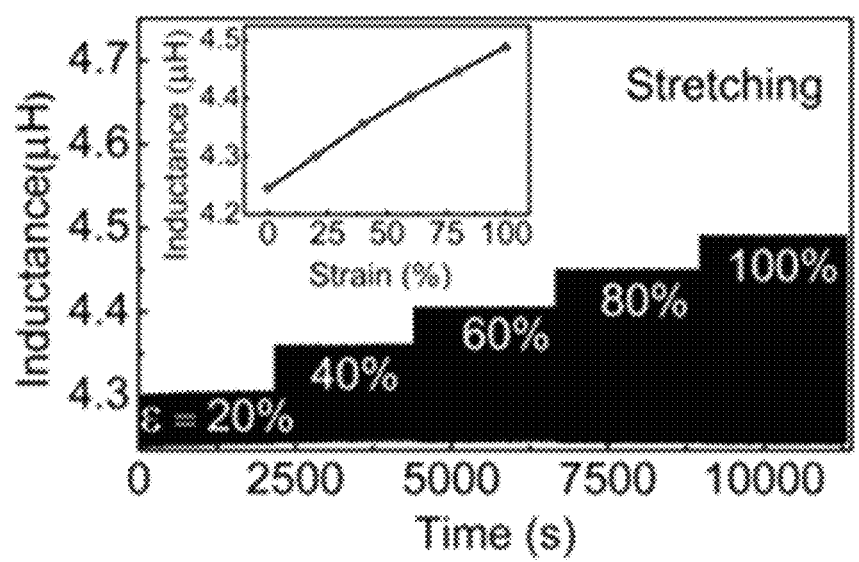
FIG. 15B is a graph showing change in inductance when Device Example 2 is repeatedly uniaxially stretched, and an image in FIG. 15B is a graph showing the measured inductance versus the strain of Device Example 2.

FIG. 14 shows images at 0% strain (ε) and 100% strain (ε) of Device Example 2, and FIG. 15A shows the resistance change during repeated uniaxial stretching of Device Example 2. FIG. 15B is a graph showing change in inductance when Device Example 2 is repeatedly uniaxially stretched, and an image in FIG. 15B is a graph showing the measured inductance versus the strain of Device Example 2.

Referring to FIGS. 14 and 15A, it is shown that a strain sensor manufactured according to Device Example 2 exhibits a negligible change in resistance even at 100% strain c, indicating the strain sensor has elasticity.

Referring to FIG. 15B, it is shown that the strain sensor manufactured according to Device Example 2 has a high inductance of 4.25 μH at 100 kHz because the strain sensor has a double-layer structure including a lower electrode and an upper electrode. This is twice the inductance (=2 μH) of a single-layer conductive coil at the same frequency, and is higher than the inductance (=~100 nH) of a stretchable coil composed of serpentine traces and the inductance (=0.712 μH) of a stretchable coil made of liquid metal microchannels.

In addition, it is shown that the strain sensor manufactured according to Device Example 2 exhibits excellent reproduction at repeated uniaxial stretching at strain ε=100%. The strain sensor showed a negligible standard deviation regardless of the strain. For example, the standard deviation was 0.9 nH at ε=0%, 0.2 nH at ε=60%, and 0.1 nH at ε=100%.

Referring to the diagram in FIG. 15B, it is shown that the strain sensor manufactured according to Device Example 2 shows a linear response of inductance to deformation. This indicates that the inductance is influenced by the area of the electrode because the resistances of the lower electrode and the upper electrode do not change.

The scope of the present invention is defined by the following claims rather than the above detailed description, and all changes or modifications derived from the meaning and scope of the claims and their equivalent concepts should be interpreted as falling into the scope of the present invention.

INDUSTRIAL APPLICABILITY

The flexible circuit electrode of the present invention exhibits metal conductivity, negligible change in resistance when defamation or mechanical damage occurs, and excellent adhesion to an elastic substrate.

In addition, the flexible circuit electrode of the present invention can maintain conductivity without destroying an oxide layer using chemical etching or mechanical scratching because the flexible circuit electrode contains conductive liquid metal microparticles including a hydrogen-doped liquid metal oxide shell.

In addition, the flexible circuit electrode of the present invention can maintain constant conductivity under conditions of a wide temperature range and a wide humidity range.

In addition, since the flexible circuit electrode can be famed through 3D circuit printing, a strain sensor with a stack of electrodes, and a method of manufacturing the same can be provided.

The invention claimed is:

1. A flexible electrode circuit comprising: a flexible substrate; and an electrode formed on the flexible substrate, wherein the electrode comprises a conductive line layer and a passivation layer, in which the conductive line layer includes a matrix including an elastic polymer and a conductive line having conductive liquid metal microparticles dispersed in the matrix, and the passivation layer comprises a coating portion coated on the conductive line and containing an elastic polymer, wherein the conductive liquid metal microparticle comprises a core containing a liquid metal and a shell surrounding the core, the shell including a hydrogen-doped liquid metal oxide.

2. The flexible electrode circuit of claim 1, wherein the flexible electrode circuit is a three-dimensional flexible electrode circuit in which a plurality of the electrodes is stacked, wherein a plurality of the conductive line layers and a plurality of the passivation layers are alternately stacked.

3. The flexible electrode circuit of claim 1, wherein the coating portion is positioned to be continuous in a longitudinal direction of the conductive line and is positioned in contact with a surface of the conductive line.

4. The flexible electrode circuit of claim 1, wherein the coating portion is positioned on an exposed surface of the conductive line and is continuous in a circumferential direction of the conductive line, the coating portion being positioned in contact with a surface of the conductive line.

5. The flexible electrode circuit of claim 1, wherein the conductive liquid metal microparticles are electrically connected to each other.

6. The flexible electrode circuit of claim 1, wherein the shell further comprises a liquid metal oxide.

7. The flexible electrode circuit of claim 1, wherein the hydrogen-doped liquid metal oxide is represented by Chemical Formula 1: [Chemical Formula 1] $M_xO_yH_z$ where M is a liquid metal, x is in a range of $0<x\le1$, y is in a range of $0<y\le1$, and z is in a range of $0<z\le1$.

8. The flexible electrode circuit of claim 1, wherein the liquid metal comprises at least one selected from the group consisting of gallium (Ga), indium (In), tin (Sn), gold (Au), and alloys thereof.

9. The flexible electrode circuit of claim 1, wherein the conductive liquid metal microparticles further comprises an elastic polymer binding to the shell and positioned outward.

10. The flexible electrode circuit of claim 9, wherein each of the conductive line layer, the passivation layer, and the elastic polymer positioned outward includes an ethylene (—C—C—) moiety in a chain thereof.

11. The flexible electrode circuit of claim 9, wherein each of the conductive line layer, the passivation layer, and the elastic polymer positioned outward comprises at least one selected from the group consisting of an ethylene-vinylacetate copolymer (PEVA), a styrene-ethylene-butylene-styrene block copolymer (SEBS), and aliphatic polyurethane.

12. A strain sensor comprising: a flexible substrate; a lower electrode formed on the flexible substrate in a planar spiral shape turning outward in a clockwise or counterclockwise direction from the center thereof; and an upper electrode formed on the lower electrode in a planar spiral shape turning outward in a direction opposite to the turning direction of the lower electrode from the center thereof, wherein the lower electrode and the upper electrode are electrically connected to each other at the center thereof, each of the lower and upper electrodes comprises a conductive line layer and a passivation layer, wherein the conductive line layer comprises a matrix containing an elastic polymer and a conductive line having hydrogen-doped liquid metal microparticles dispersed in the matrix, and the passivation layer comprises a coating portion coated on the conductive line and containing an elastic polymer.

13. The strain sensor of claim 12, wherein the passivation layer in each of the lower and upper electrodes has a thickness of 1 to 10 μm.

14. A method of manufacturing a flexible electrode circuit, the method comprising: (a) preparing a mixed solution by mixing an elastic polymer, a liquid metal, a radical initiator, and a solvent; (b) preparing a conductive ink containing conductive liquid metal microparticles by ultrasonically treating the mixed solution; and (c) manufacturing the flexible electrode circuit of claim 1 by performing printing with the conductive ink and performing thermal annealing, wherein each of the conductive liquid metal microparticles comprises a core containing a liquid metal and a shell surrounding the core and containing a hydrogen-doped liquid metal oxide.

15. The method of claim 14, wherein during a period between the printing and the thermal annealing, a self-passivation phenomenon in which the conductive liquid metal microparticles of the conductive ink move down and the solvent and the elastic polymer move up occurs.

16. The method of claim 14, wherein the mixed solution contains the liquid metal in an amount of 5% to 50% by volume (v/v%) with respect to 100% by volume of the elastic polymer.

* * * * *